United States Patent [19]
Yang et al.

[11] Patent Number: 6,147,367
[45] Date of Patent: Nov. 14, 2000

[54] PACKAGING DESIGN FOR LIGHT EMITTING DIODE

[75] Inventors: Hung-Pin Yang; Rong-Yih Hwang; Jung-Tsung Hsu; Huey-Fen Liu, all of Hsinchu, Taiwan

[73] Assignee: Industrial Technology Research Institute, Hsinchu, Taiwan

[21] Appl. No.: 09/048,710

[22] Filed: Mar. 26, 1998

[30] Foreign Application Priority Data

Dec. 10, 1997 [TW] Taiwan ................................ 86118568

[51] Int. Cl.⁷ ............................................. H01L 33/00
[52] U.S. Cl. ................................. 257/88; 257/81
[58] Field of Search ............................ 257/81, 74, 88, 257/99

[56] References Cited

U.S. PATENT DOCUMENTS 5,324,962  6/1994  Komoto et al. .

FOREIGN PATENT DOCUMENTS 4107526  10/1991  Germany .
1-32688   2/1989   Japan .

*Primary Examiner*—Sheila V. Clark
*Attorney, Agent, or Firm*—Knobbe, Martens, Olson & Bear, LLP

[57] ABSTRACT

An LED package assembly comprising two or more light emitting diode dies within an epoxy housing such that a wider light emitting angle with a higher light intensity everywhere around the package including its bottom part is obtained. The LED package can be a substitute for bulb illumination or serving some decorative functions. Furthermore, the LED has low power consumption, a tough body and a long working life. Moreover, a cluster of these LEDs in a large display screen is capable of enhancing clarity of vision and the range of observation from a few meters to a few kilometers away.

30 Claims, 14 Drawing Sheets

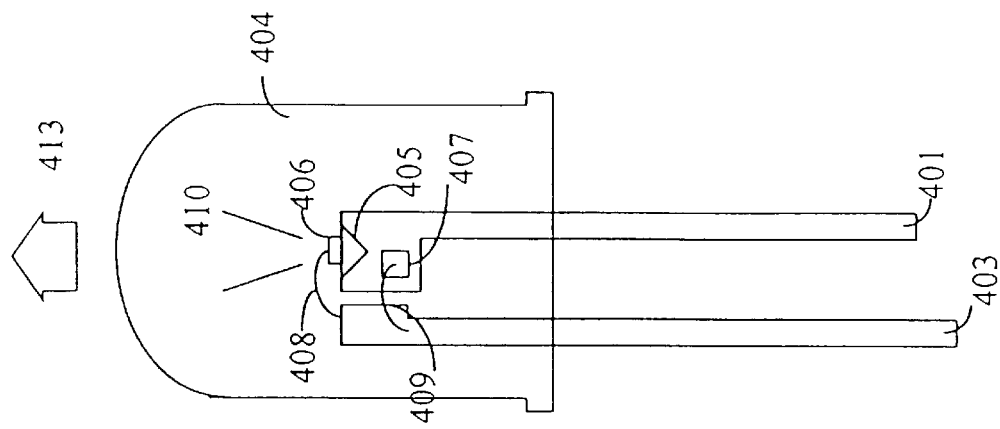
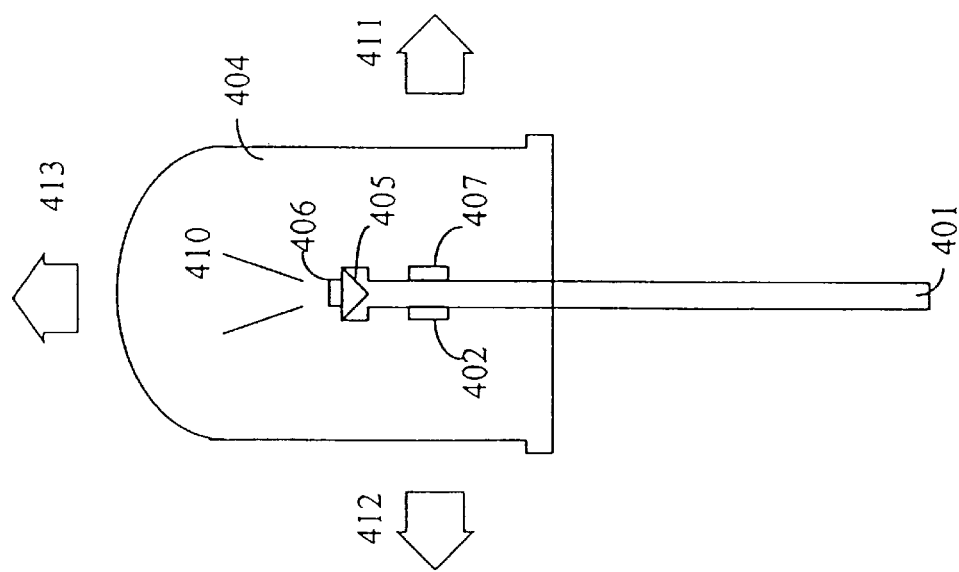

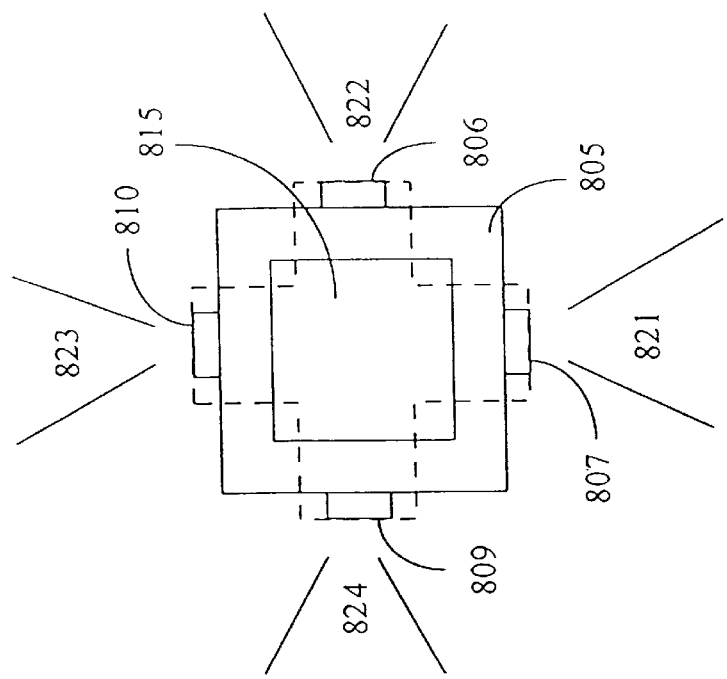
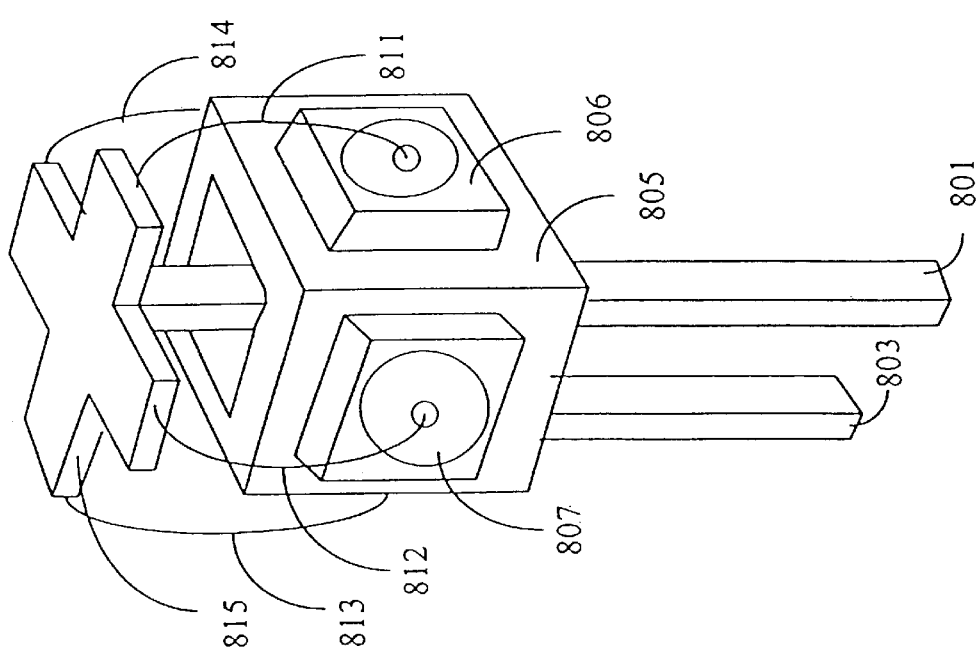
FIG. 8b
FIG. 8a

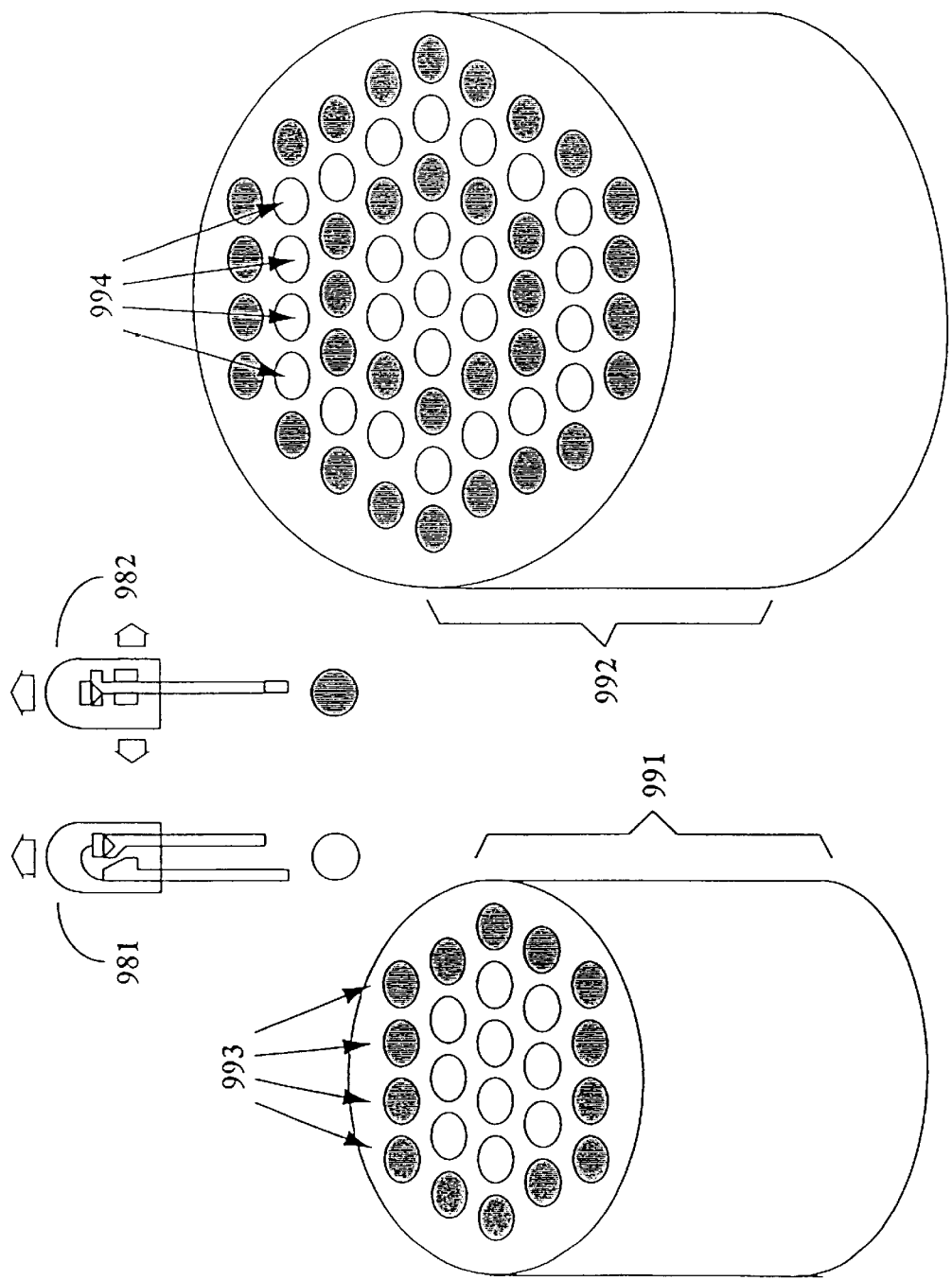

PACKAGING DESIGN FOR LIGHT EMITTING DIODE

CROSS-REFERENCE TO RELATED APPLICATION

This application claims the priority benefit of Taiwan application serial no. 86118568, filed Dec. 10, 1997, the full disclosure of which is incorporated herein by reference.

BACKGROUND OF THE INVENTION

1. Field of Invention

The present invention relates to a packaging design for light emitting diode (LED). More particularly, the present invention relates to a light emitting diode package design that packs two or more LED dies inside the same LED package.

2. Description of Related Art

Light emitting diode (LED) is a junction diode formed by an epitaxial P-type layer and an epitaxial N-type layer on a heavily doped semiconductor compound base. The diode further includes an ohmic metallic contact on the P-type and N-type layers. In general, an LED is formed by first growing the necessary epitaxial layers on a heavily doped semiconductor compound base, and then forming ohmic metallic contacts on the P-type and N-type layers respectively. Thereafter, the die is diced out, fixed onto a panel base, wire-bonded, and then sealed by an epoxy packaging. There are several epitaxial growth methods for forming the epitaxial layer. They include the liquid crystal epitaxial growth method, the vapor phase epitaxial growth method, the metal-organic chemical vapor epitaxial growth method and the molecular beam epitaxial growth method. In addition, for forming a blue LED, an epitaxial layer is grown on an aluminum oxide/sapphire base instead.

LED is mainly packaged within an epoxy or a metallic housing. Visible LED are generally used in display screens, automobile braking lights, scanners, indicator lights for equipment and so on. At present, various colors can be generated according to the type of epitaxial layer formed in the LED die, which includes blue, red, orange, green, yellow and yellowish-green. Therefore, a multi-colored display screen formed by a collection of LEDs is available in the market nowadays.

Most conventional LEDs are packaged such that light emitted from the LED is uni-directional. In other words, the LEDs has such a narrow light-emitting angle that any display screens formed by the LEDs will have a small viewing angle beyond which one can hardly see. Therefore, conventional LEDs are unsuitable for illumination. In addition, when the distance between the viewer and the screen is too short, any images on the screen such as numbers, words or pictures will become so blurred that nothing seems to be discernible because the side of the LED emits rather poorly.

In light of the foregoing, there is a need to improve the packaging design of an LED.

SUMMARY OF THE INVENTION

Accordingly, the present invention is to provide an LED packaging that packs a multiple of LEDs into an epoxy package. This compact LED package has a larger light emitting angle, and a stronger light intensity emitting from all sides including the bottom. Thus, the LEDs can act as a source of illumination substituting light bulbs and can serve a decorative function as well. Moreover, the LED has low power consumption, tough and can remain operational for a long time. Therefore, it can be used as the illuminating source in a large display screen for increasing the field of view from a few meters to a few kilometers.

To achieve these and other advantages and in accordance with the purpose of the invention, as embodied and broadly described herein, the invention provides a light emitting diode packaging design comprising an epoxy housing, a plurality of light emitting diode dies, a plurality of metallic pins, a plurality of flat panel bases at the upper end of the metallic pin for mounting the light emitting diodes, and a plurality of bonding wires for connecting a terminal of the light emitting diode die with one of the metallic pins.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 4a and 4b are two mutually perpendicular views of an LED package having three LED dies packaged within the epoxy housing according to this invention;

FIGS. 8a and 8b are the respective perspective view and the top view of an LED package having four LED dies packaged within the epoxy housing according to this invention;

FIGS. 10a and 10b are perspective views of two LED clusters formed by assembling a collection of single die LEDs fabricated according to conventional design and a collection of multiple dies LEDs fabricated according to this invention together;

DESCRIPTION OF THE PREFERRED EMBODIMENTS

Figure 1:
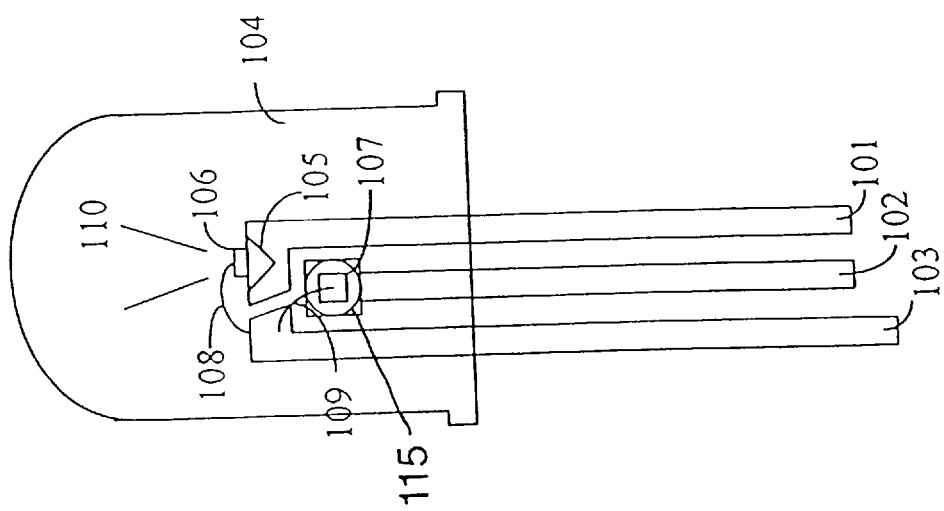
FIG. 1 is a typical sketch of LED dies packaged according to the packaging design of this invention.

Reference will now be made in detail to the present preferred embodiments of the invention, examples of which are illustrated in the accompanying drawings. Wherever possible, the same reference numbers are used in the drawings and the description to refer to the same or like parts.

According to this invention, a number of LEDs are packaged into the same housing. Various LEDs can be mounted onto a flat panel base or a panel that has a metal-coated reflecting hemispherical or hemi-ellipsoid shaped reflecting mirror at the back for focusing the light from the LED. The upper electrode of the LED die is connected to a metallic pin by a piece of metallic wire. The flat panel bases can be located at the upper end of the same metallic pin, or located at the upper end of different metallic pins. The axis of light emission for different LED dies in the same package can be mutually perpendicular, or the axis can subtend symmetrical angles. Moreover, the LEDs of this invention can be packaged into a housing having an external shape that conforms to a conventional packaging, or packaged inside an all-focusing spherical housing. Furthermore, since the LED are connected in parallel together, current flowing in each individual LED is small, leading to a longer life for the LED. Consequently, the LED package fabricated according to this invention can provide more light intensity due to the use of a multiple of diodes, and can functions longer due to LEDs connected in parallel. Therefore, display panels that use the above LEDs are likely to be more reliable. Because the LED dies are located in different places and at different angles inside the package, the light-emitting angle of the LEDs is large, and so the field of view for a display panel formed by a collection of the LEDs is correspondingly increased. Besides, by varying the shape of the epoxy housing, the focusing characteristic of an LED can be changed to fit the particular light emission requirements.

According to the design characteristics, a detailed description of each preferred embodiment is given below.

FIG. 1 is a typical sketch of the LED dies packaged according to the packaging design of this invention. The LED package mainly includes an epoxy housing 104, metallic pins 101, 102 and 103 acting as anode and cathodes, LED dies 106 and 107, flat panel bases 105 and 115, metallic wires 108 and 109, and light emitting directions 110 and from the sides. The flat panel base 105 located at the upper end of the metallic pin 101 is used for mounting the LED die 106. The flat panel base 115 located at the upper end of the metallic pin 102 is used for mounting the LED die 107, however, the LED die 107 is mounted to face one side. LED dies 106 and 107 are mounted onto the flat panel bases 105 and 115 respectively by a method such as soldering, gluing using a gold paste, gluing using a silver paste or mounting with Indium. The upper terminal of the dies 106 and 107 is connected to the top part of the metallic pin 103 using metallic wires 108 and 109, respectively. LED die 106 emits light from the top portion of the package and LED die 107 emits light from the side of the package. Furthermore, the flat panel bases 105 and 115 can further include a conical or hemi-ellipsoid shaped reflecting mirror for reflecting and focusing the LED output.

Figure 2B:
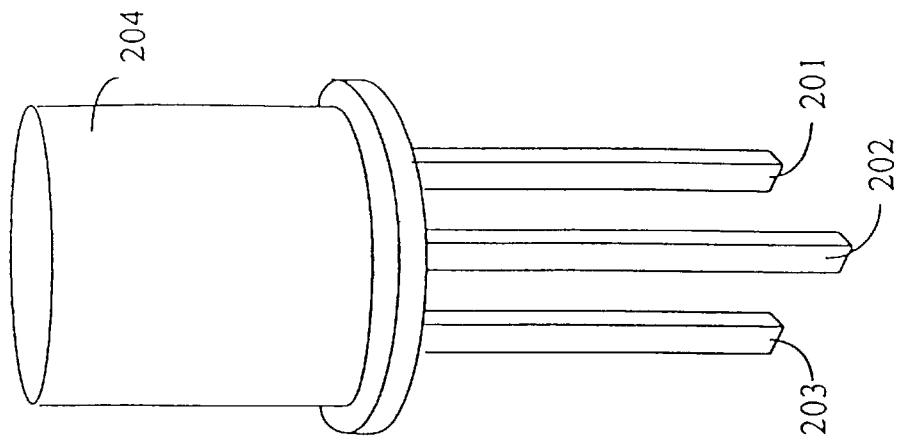
FIGS. 2a and 2b are the respective side view and perspective view of an LED package having two LED dies packaged within the epoxy housing according to this invention.
Figure 2A:
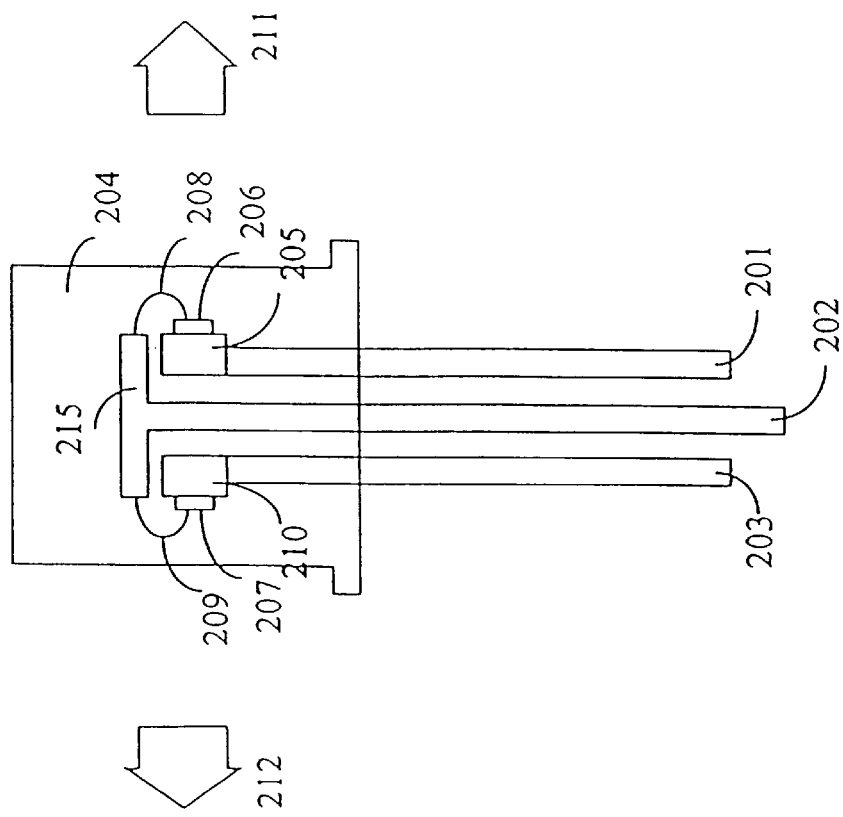

FIGS. 2a and 2b are the respective side view and perspective view of an LED package having two LED dies packaged within the epoxy housing according to this invention. The LED package mainly includes an epoxy housing 204, metallic pins 201, 202 and 203 acting as anode and cathodes, a flat panel base 205 located at the upper end of the metallic pin 201, a flat panel base 210 located at the upper end of the metallic pin 203, LED dies 206 and 207, metallic wires 208 and 209, and light emitting directions 211 and 212 from two sides. The two flat panel bases 205 and 210 are backing on each other and facing out towards the sides of the housing 204. The LED die 206 is mounted onto the flat panel base 205, with the upper electrode of the die 206 connected by the metallic wire 208 to a top electrode 215 at the top part of the metallic pin 202. Similarly, the LED die 207 is mounted onto the flat panel base 210, with the upper electrode of the die 207 connected by the metallic wire 209 to a top electrode 215. LED dies 206 and 207 are mounted onto the flat panel bases 205 and 210 respectively by a method such as soldering, gluing using a gold paste, gluing using a silver paste or mounting with Indium. LED dies 206 and 207 emit light from the sides of the package.

Figure 3B:
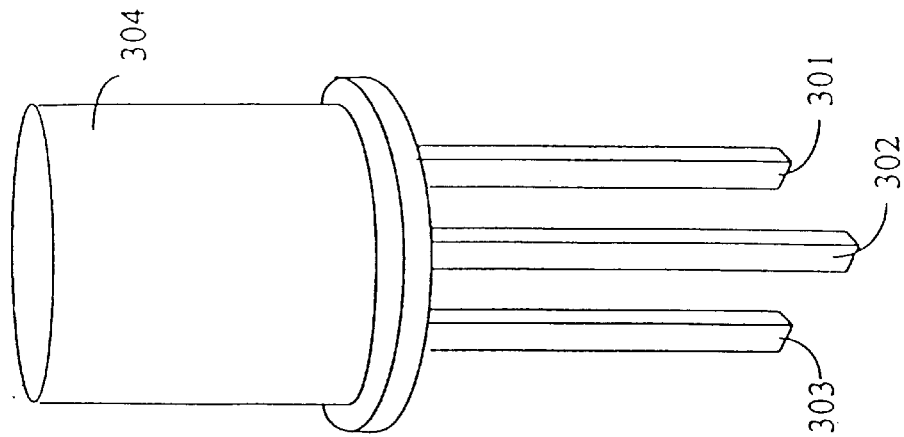
FIGS. 3a and 3b are the respective side view and perspective view of another LED package having two LED dies packaged within the epoxy housing according to this invention.
Figure 3A:
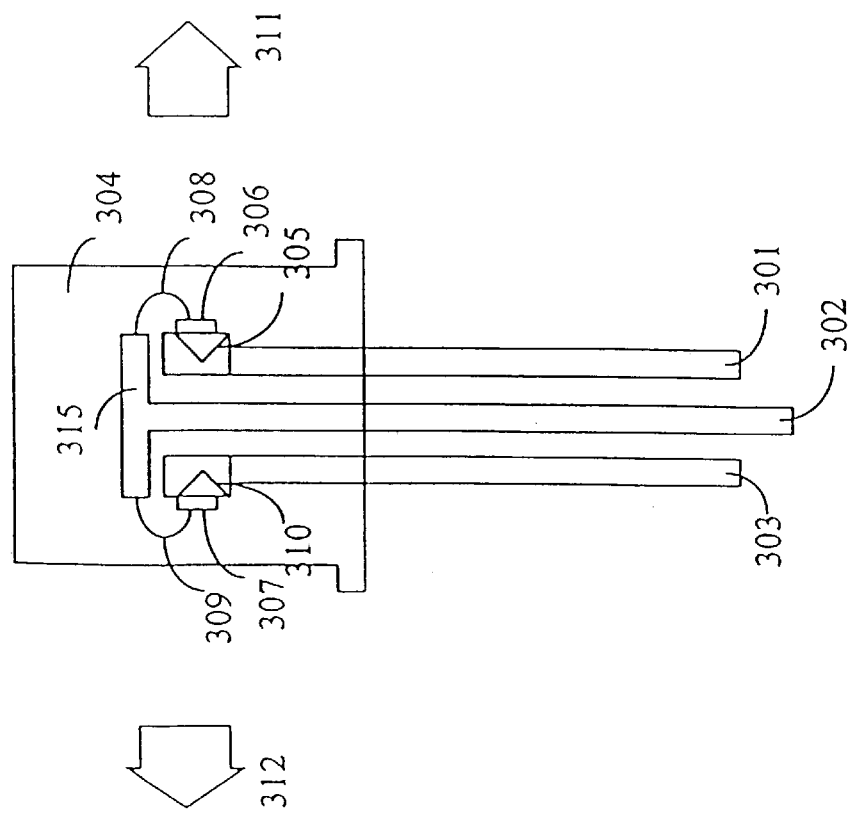

FIGS. 3a and 3b are the respective side view and perspective view of another LED package having two LED dies packaged within the epoxy housing according to this invention. The LED package mainly includes an epoxy housing 304, metallic pins 301, 302 and 303 acting as anode and cathode, a flat panel base 305 located at the upper end of the metallic pin 301, a flat panel base 310 located at the upper end of the metallic pin 303, LED dies 306 and 307, metallic wires 308 and 309, and light emitting directions 311 and 312 on two sides. The two flat panel bases 305 and 310 are back to back and facing out towards the side of the housing 304. The LED die 306 is mounted onto the flat panel base 305, with the upper electrode of the die 306 connected by the metallic wire 308 to a top electrode 315 at the top of the metallic pin 302. Similarly, the LED die 307 is mounted onto the flat panel base 310, with the upper electrode of the die 307 connected by a metallic wire 309 to the top electrode 315. LED dies 306 and 307 are mounted onto the flat panel bases 305 and 310 respectively by a method such as soldering, gluing using a gold paste, gluing using a silver paste or mounting with Indium. LED dies 306 and 307 emit light from the sides of the package. Moreover, the flat panel bases 105 and 115 can further include a conical or hemi-ellipsoid shaped reflecting mirror for reflecting and focusing the LED output.

FIGS. 4a and 4b are two mutually perpendicular views of an LED package having three LED dies packaged within the epoxy housing according to this invention. The LED package mainly includes an epoxy housing 404, metallic pins 401 and 403 acting as anode and cathode, a flat panel base 405 located at the upper end of the metallic pin 401, two flat panel bases (not shown in the figure) located on each side near the top of the metallic pin 401, LED dies 402, 406 and 407, metallic wires 408, 409 and 416 (in FIG. 4b), and light emitting directions 411, 412 and 413. The LED die 406 is mounted onto the flat panel base 405 at the top of metallic pin 401, with the upper electrode of the die 406 connected by the metallic wire 408 to a top electrode at the upper part of the metallic pin 403. Similarly, the LED dies 402 and 407 are mounted onto the flat panel bases on the sides of the metallic pin 401 slightly below the top, with the upper electrodes of the dies 402 and 407 connected by metallic wires to the upper electrode of the metallic pin 403. LED dies 402, 406 and 407 are mounted onto their respective flat panel bases by a method such as soldering, gluing using a gold paste, gluing using a silver paste or mounting with Indium. LED die 406 emits light from the upper part of the package, while LED dies 402 and 407 emit light from the sides of the package. Moreover, the flat panel bases can further include a conical or hemi-ellipsoid shaped reflecting mirror for reflecting and focusing the LED output.

Figure 5B:
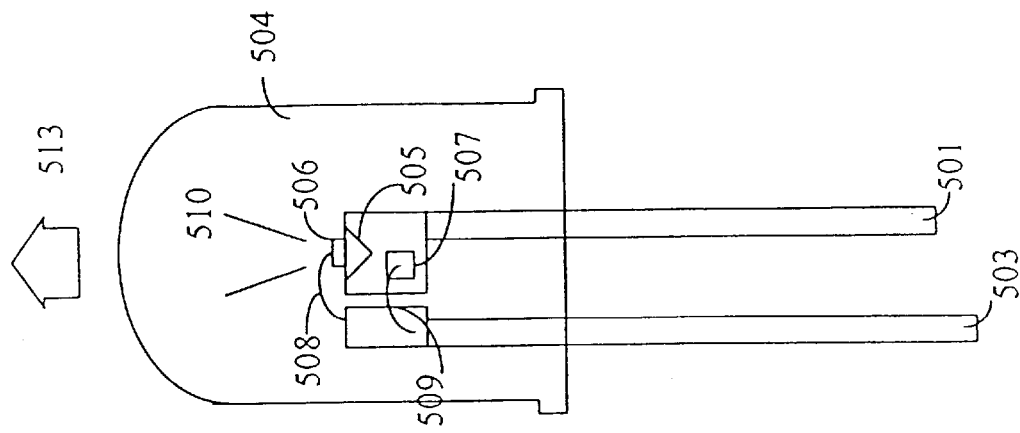
FIGS. 5a and 5b are two mutually perpendicular views of another LED package having three LED dies packaged within the epoxy housing according to this invention, where the LED dies are mounted respectively on two tilted flat panel bases.
Figure 5A:
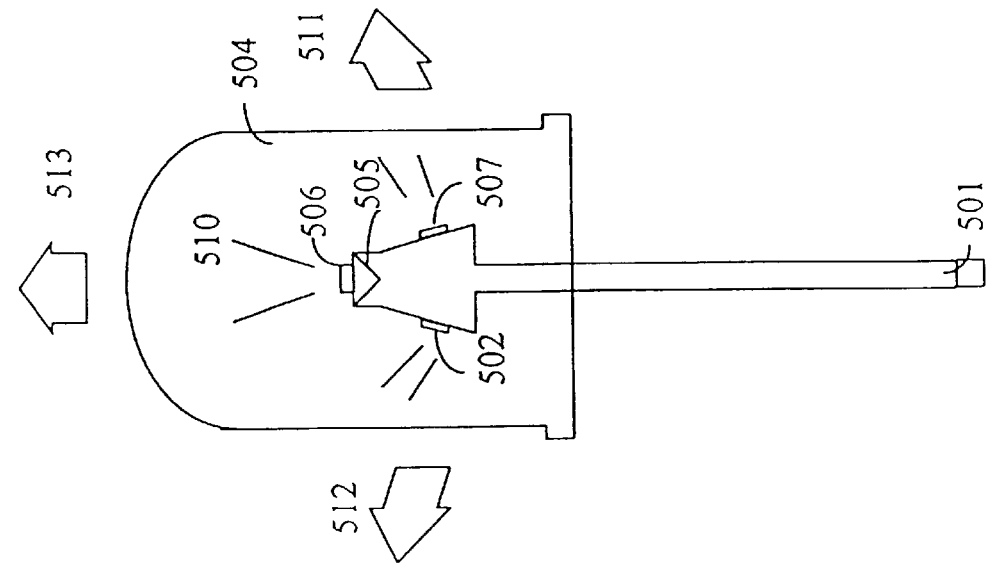

FIGS. 5a and 5b are two mutually perpendicular views of another LED package having three LED dies packaged within the epoxy housing according to this invention, where the LED dies are mounted respectively on two tilted flat panel bases. The LED package mainly includes an epoxy housing 504, metallic pins 501 and 503 acting as anode and cathode, a flat panel base 505 located at the upper end of the metallic pin 501, two flat panel bases (not shown in the figure) located on each side near the top of the metallic pin 501 that tilt slightly away from the vertical direction, LED dies 502, 506 and 507, metallic wires 508, 509 and 516 (in FIG. 5b), and light emitting directions 511, 512 and 513. The LED die 506 is mounted onto the flat panel base 505 at the top of metallic pin 501, with the upper electrode of the die 506 connected by the metallic wire 508 to a top electrode at the upper part of the metallic pin 503. Similarly, the LED dies 502 and 507 are mounted onto the flat panel bases on the sides of the metallic pin 501 slightly below the top, with the upper electrodes of the dies 502 and 507 connected by metallic wires 509 and 516 to the upper part of the metallic pin 503. The two flat panel bases for holding LED dies 502 and 507 are placed back-to-back and formed a small tilt angle less than 90° with a line parallel to the vertical metallic pin 501 direction. Therefore, the light emitting direction is slightly tilted up. LED dies 502, 506 and 507 are mounted onto their respective flat panel bases by a method such as soldering, gluing using a gold paste, gluing using a silver paste or mounting with Indium. LED die 506 emits light from the upper part of the package in a direction 513, while LED dies 502 and 507 emit light from the sides of the package in directions 511 and 512. Moreover, the flat panel bases can further include a conical or hemi-ellipsoid shaped reflecting mirror for reflecting and focusing the LED output.

Figure 6B:
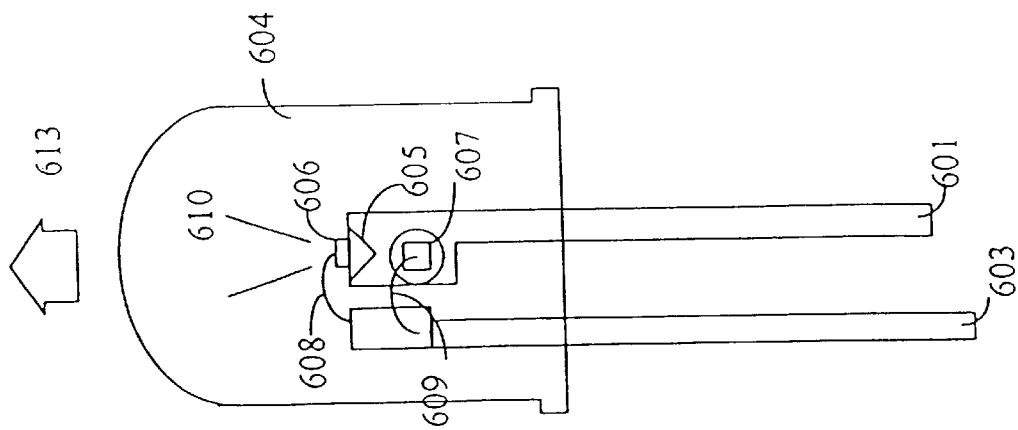
FIGS. 6a and 6b are two mutually perpendicular views of yet another LED package having three LED dies packaged within the epoxy housing according to this invention.
Figure 6A:
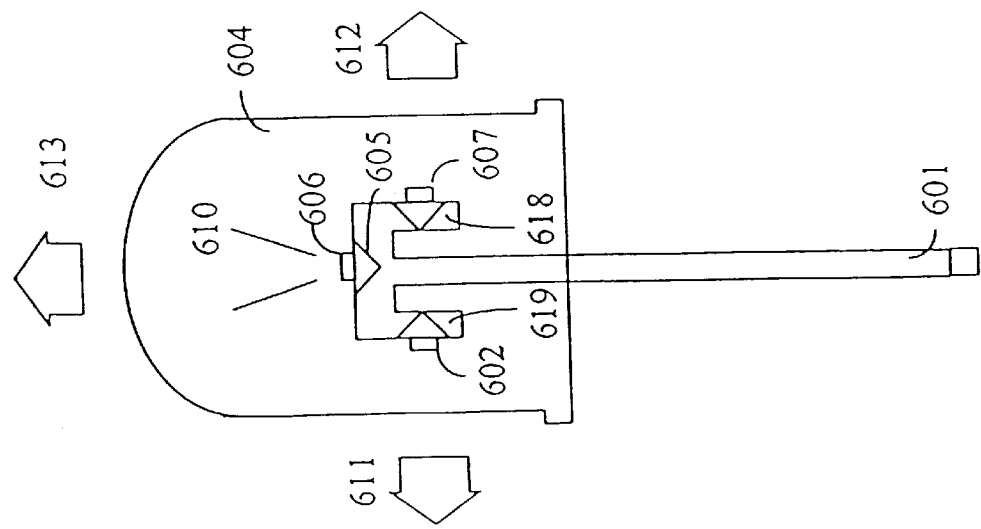

FIGS. 6a and 6b are two mutually perpendicular views of yet another LED package having three LED dies packaged within the epoxy housing according to this invention. The LED package mainly includes an epoxy housing 604, metallic pins 601 and 603 acting as anode and cathode, a flat panel base 605 located at the upper end of the metallic pin 601, two flat panel bases 618 and 619 located on each side near the top of the metallic pin 601, LED dies 602, 606 and 607, metallic wires 608, 609 and 616 (in FIG. 6b), and light emitting directions 611, 612 and 613. The LED die 606 is mounted onto the flat panel base 605 at the top of metallic pin 601, with the upper electrode of the die 606 connected by the metallic wire 608 to a top electrode at the upper part of the metallic pin 603. Similarly, the LED dies 602 and 607 are mounted onto the flat panel bases 618 and 619 on the sides of the metallic pin 601 slightly below the top, with the upper electrodes of the dies 602 and 607 connected by metallic wires 609 and 616 to the upper part of the metallic pin 603. LED dies 602, 606 and 607 are mounted onto their respective flat panel bases by a method such as soldering, gluing using a gold paste, gluing using a silver paste or mounting with Indium. LED die 606 emits light from the upper part of the package in a direction 613, while LED dies 602 and 607 emit light from the sides of the package in directions 611 and 612. Moreover, the flat panel bases can further include a conical or hemi-ellipsoid shaped reflecting mirror for reflecting and focusing the LED output.

Figure 7:
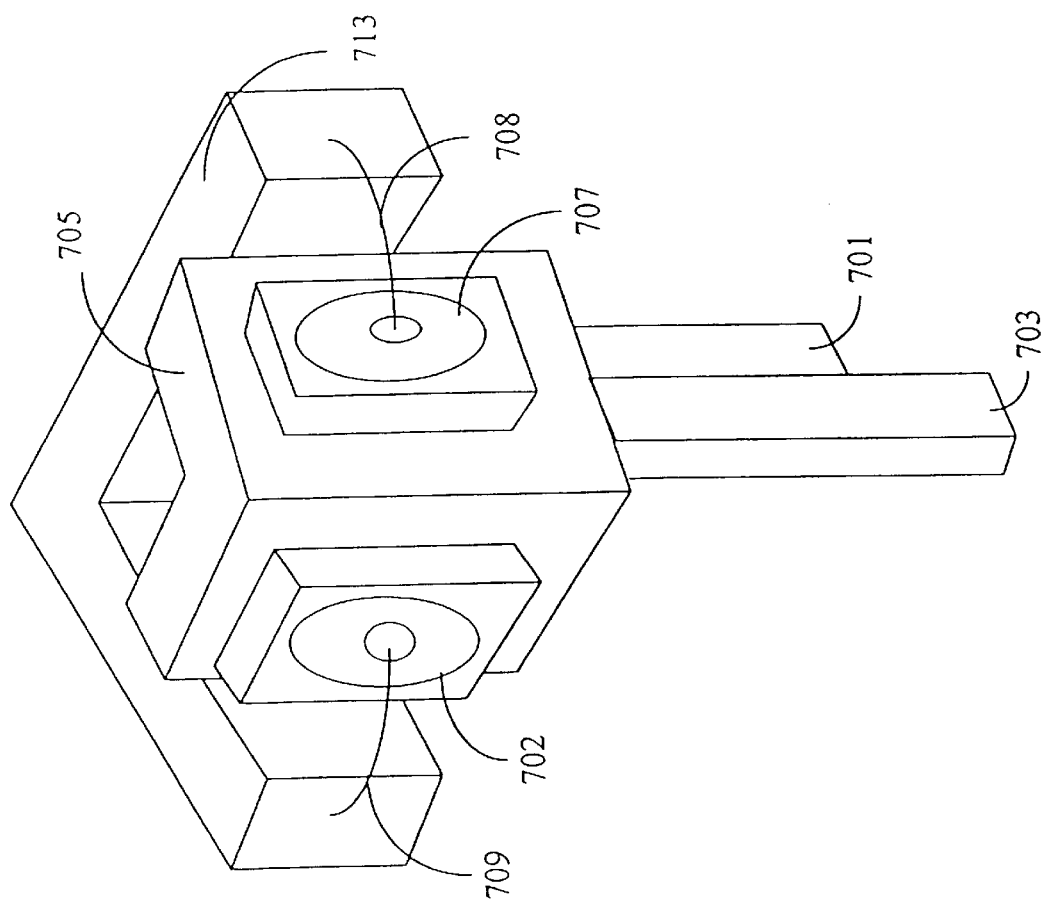
FIG. 7 is a perspective view of yet another LED package having two LED dies packaged within the epoxy housing according to this invention.

FIG. 7 is a perspective view of yet another LED package having two LED dies packaged within the epoxy housing according to this invention. The LED package mainly includes metallic pins 701 and 703 acting as anode and cathode, a flat panel base 705 located at the upper end of the metallic pin 703, LED dies 702 and 707, metallic wires 708 and 709, and a top electrode 713 at the top a metallic pin 701. The flat panel base 705 is for mounting dies 702 and 707. The upper electrode of the die 707 is connected by the metallic wire 708 to a top electrode 713 at the top of the metallic pin 701. Similarly, the LED die 702 is connected by the metallic wire 709 to the top electrode 713 at the top of the metallic pin 701. LED dies 702 and 707 are mounted onto the flat panel base 705 by a method such as soldering, gluing using a gold paste, gluing using a silver paste or mounting with Indium. Moreover, the flat panel base can further include a conical or hemi-ellipsoid shaped reflecting mirror for reflecting and focusing the LED output.

FIGS. 8a and 8b are the respective perspective view and the top view of an LED package having four LED dies packaged within the epoxy housing according to this invention. The LED package mainly includes metallic pins 801 and 803 acting as anode and cathode, a flat panel base 805 located at the upper end of the metallic pin 803, LED dies 806, 807, 809 and 810, metallic wires 811, 812, 813 and 814, and a top electrode 815 at the top a metallic pin 801. The flat panel base 805 is for mounting dies 806, 807, 809, and 810. The upper terminal of the die 806 is connected by the metallic wire 811 to the top electrode 815 at the top of the metallic pin 801. Similarly, the LED dies 807, 809 and 810 are connected by the respective metallic wires 812, 813 and 814 to the top electrode 815 at the top of the metallic pin 801. LED dies 806, 807, 809 and 810 are mounted onto the flat panel base 805 by a method such as soldering, gluing using a gold paste, gluing using a silver paste or mounting with Indium. Moreover, the flat panel base can further include a conical or hemi-ellipsoid shaped reflecting mirror for reflecting and focusing the LED output.

Figure 9A:
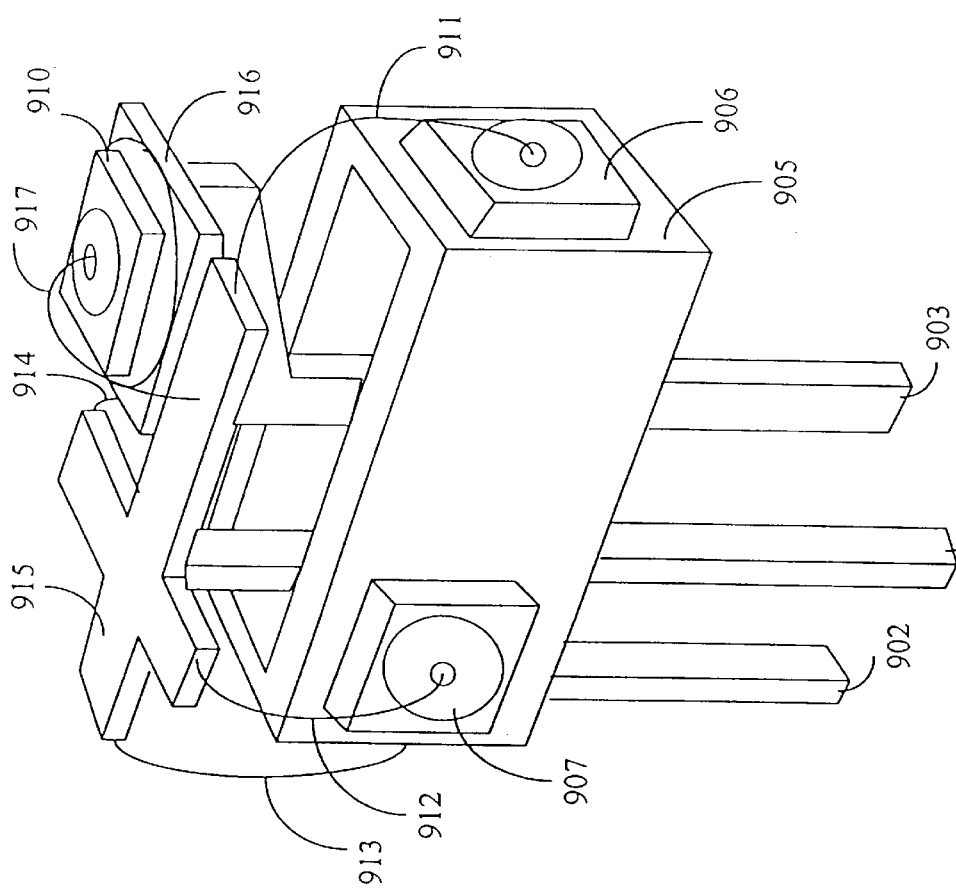
FIGS. 9a and 9b are the respective perspective view and the top view of an LED package having five LED dies packaged within the epoxy housing according to this invention.
Figure 9B:
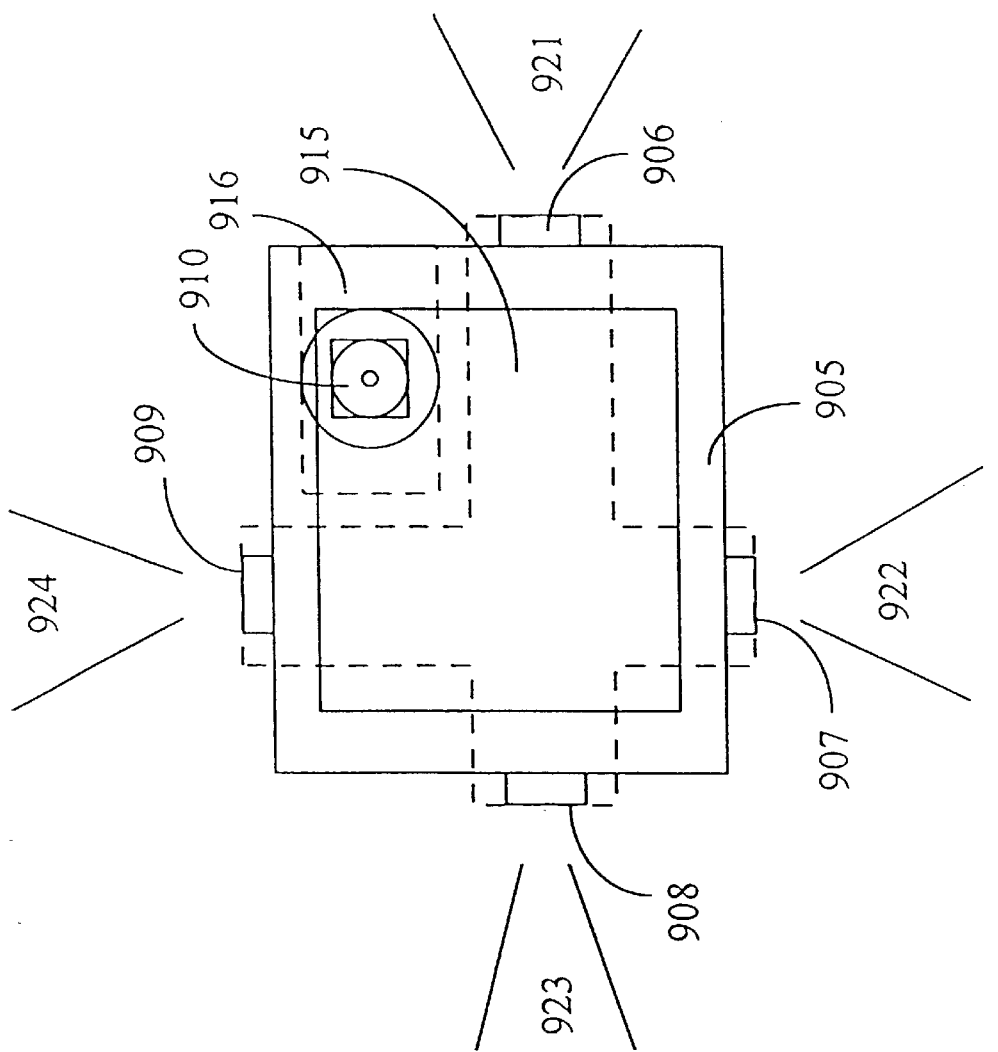

FIGS. 9a and 9b are the respective perspective view and the top view of an LED package having five LED dies packaged within the epoxy housing according to this invention. The LED package mainly includes metallic pins 901, 902 and 903 acting as anode and cathode, a flat panel base 916 located at the upper end of the metallic pin 903, a flat panel base 905 located at the upper end of the metallic pin 902, LED dies 906, 907, 908, 909 and 910, metallic wires 911, 912, 913, 914 and 917, and atop electrode 915 at the top a metallic pin 901. The flat panel base 905 is for mounting dies 906, 907, 908 and 909. The upper terminal of the die 906 is connected by the metallic wire 911 to the top electrode 915 at the top of the metallic pin 901. Similarly, the LED dies 907, 908 and 909 are connected by the respective metallic wires 912, 913 and 914 to the top electrode 915 at the top of the metallic pin 901. The flat panel base 916 is for mounting die 910. The upper electrode of the die 910 is connected by the metallic wire 917 to the top electrode 915 at the top of the metallic pin 901. LED dies 906, 907, 908, 909 and 910 are mounted onto the respective flat panel bases 905 and 916 by a method such as soldering, gluing using a gold paste, gluing using a silver paste or mounting with Indium. Light emitted by the LED dies 906, 907, 908 and 909 are in the directions 921, 922, 923 and 924, respectively. Moreover, the flat panel base can further include a conical or hemi-ellipsoid shaped reflecting mirror for reflecting and focusing the LED output.

FIGS. 10a and 10b are perspective views of two LED clusters formed by assembling a collection of single die LEDs fabricated according to conventional design and a collection of multiple dies LEDs fabricated according to this invention together. As shown in FIGS. 10a and 10b, LED clusters 991 and 992 both use conventional LEDs 981 in positions marked LED 994 and multiple diode type of LEDs 982 in positions marked LED 993. LED type 981 and LED type 982 form alternating layers around the core. Through this LED arrangement, clarity of images such as words and pictures in a display screen will be enhanced. Moreover, the viewing distance and angle of vision will be increased as well.

Figure 11A:
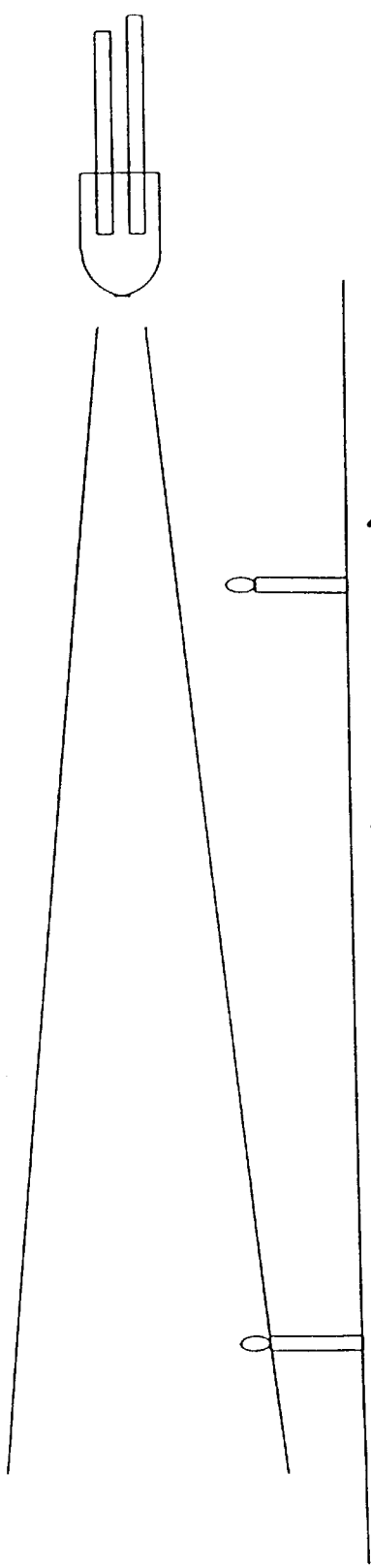
FIGS. 11a and 11b are side views showing the respective light emitting angles for a conventional single die LED and a multiple dies LED fabricated according to this invention.
Figure 11B:
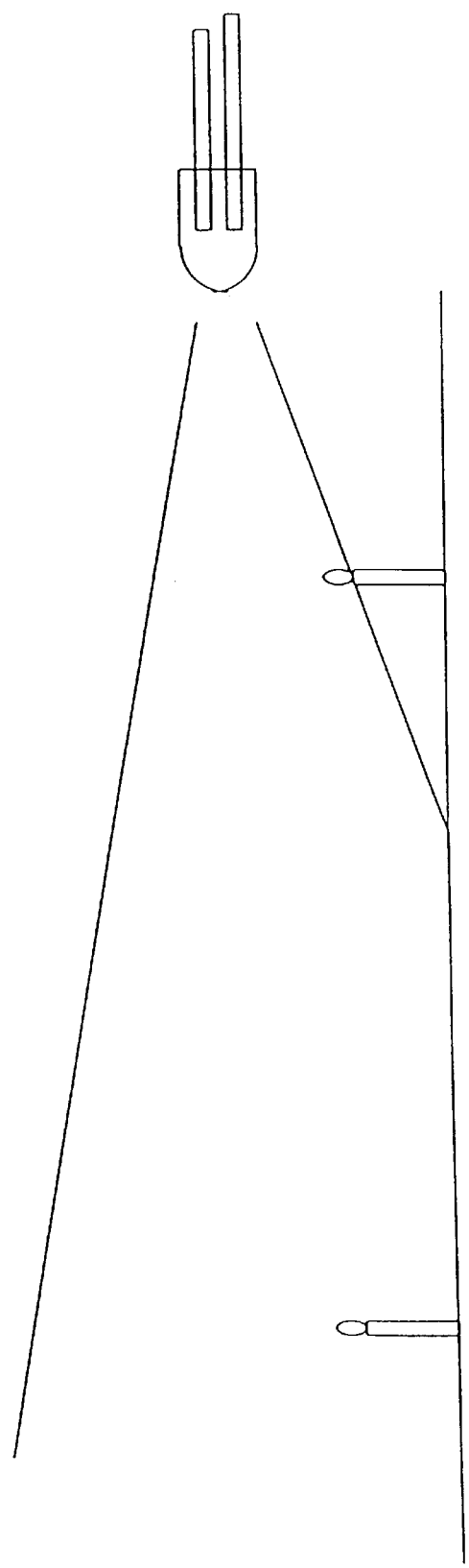

FIGS. 11a and 11b are side views showing the respective light emitting angles for a conventional single die LED and a multiple dies LED fabricated according to this invention. Because two or more LEDs are used in the package of this invention (FIG. 11b), the light emitting angle or the viewing angle is larger than a conventional single die LED (FIG. 11a).

Figure 12A:
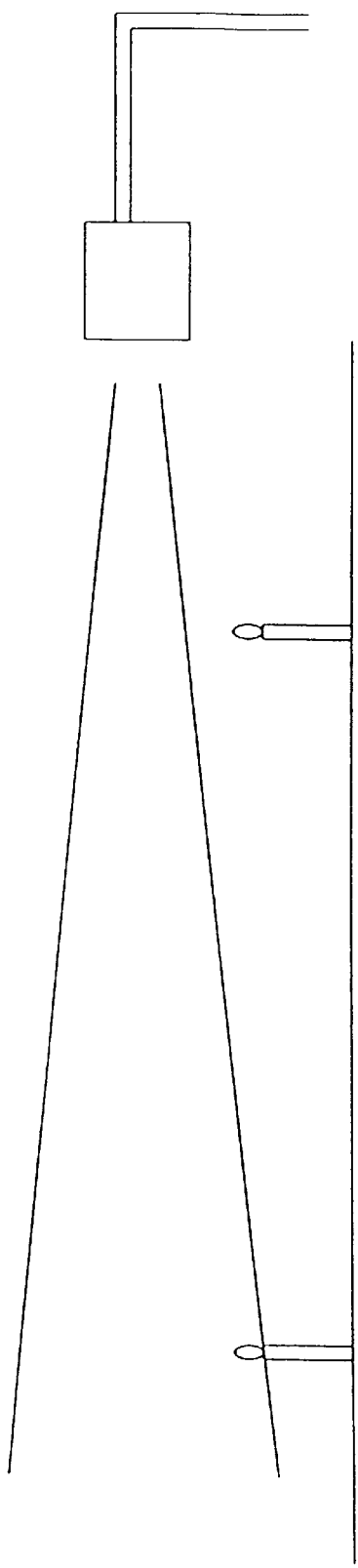
FIGS. 12a and 12b are side views showing the respective light emitting angles for a cluster of conventional single die LEDs and a cluster of multiple dies LEDs fabricated according to this invention.
Figure 12B:
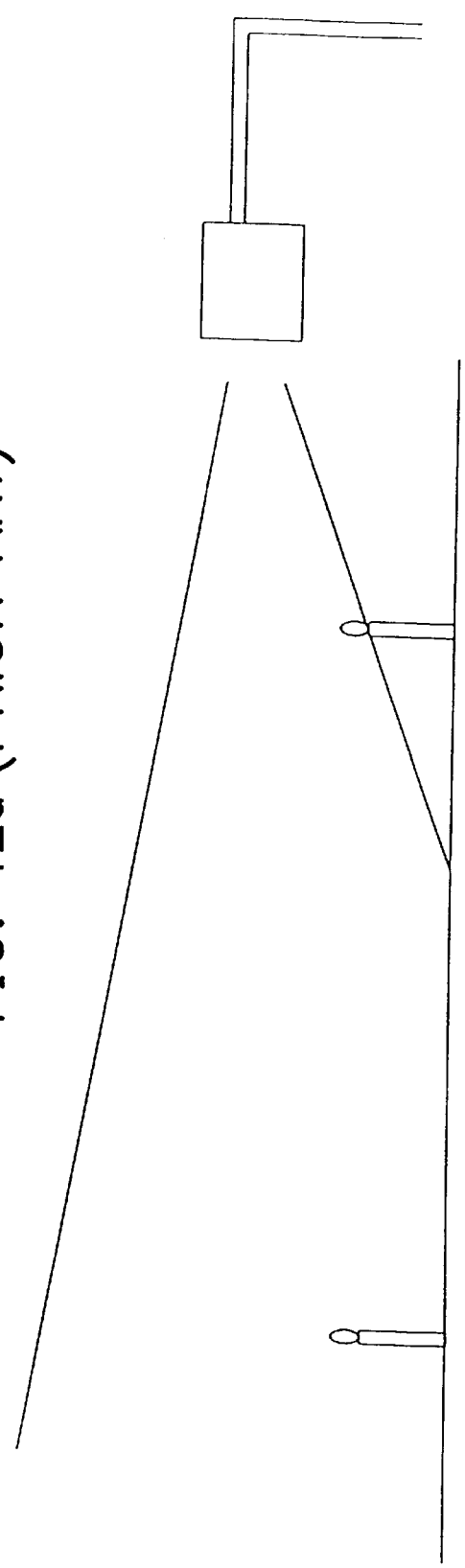

FIGS. 12a and 12b are side views showing the respective light emitting angles for a cluster of conventional single die LEDs and a cluster of multiple dies LEDs fabricated according to this invention. Because the light emitting angle for each LED according to this invention has improved, the light emitting angle or viewing angle is larger for a cluster of these multiple LED packaged according to this invention (FIG. 12b) than a similar cluster of conventional LEDs (FIG. 12a).

Figure 13B:
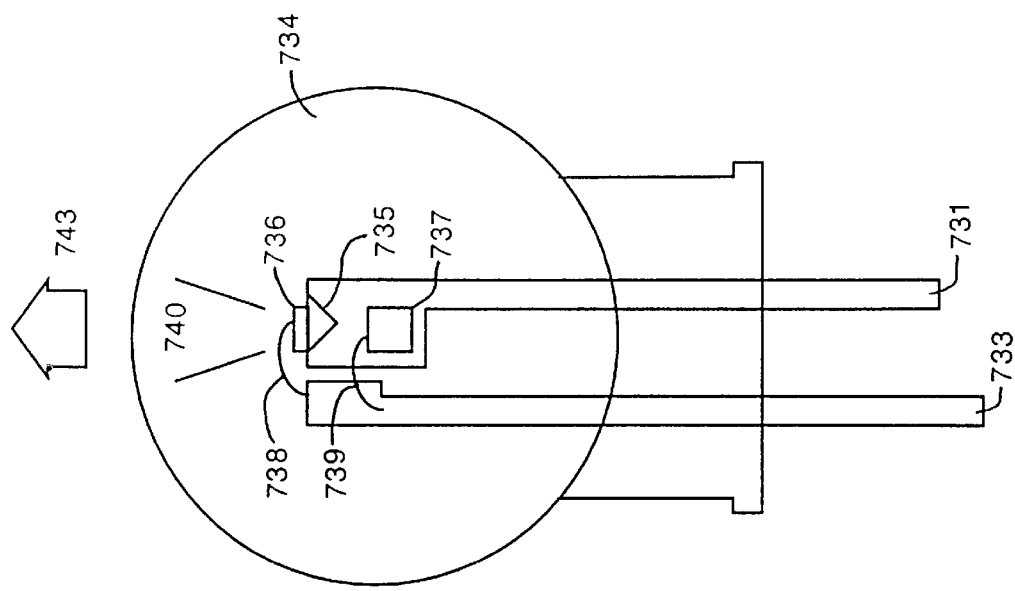
FIGS. 13a and 13b are two mutually perpendicular views of yet another LED package having three LED dies packaged within a spherical epoxy housing according to this invention.
Figure 13A:
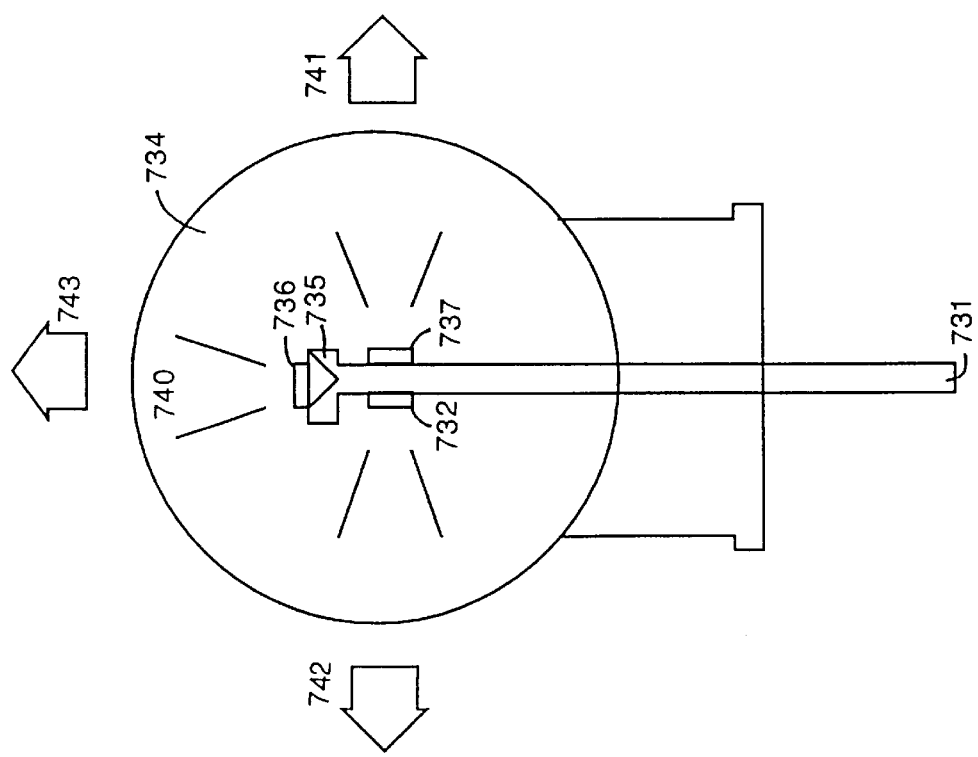

FIGS. 13a and 13b are two mutually perpendicular views of yet another LED package having three LED dies packaged within a spherical epoxy housing according to this invention. The LED package mainly includes an epoxy housing 734, metallic pins 731 and 733 acting as anode and cathode, a flat panel base 735 located at the upper end of the metallic pin 731, two flat panel bases (not shown in the figure) located on each side near the top of the metallic pin 731, LED dies 732, 736 and 737, metallic wires 738, 739 and 746 (in FIG. 13b), and light emitting directions 741, 742 and 743. The LED die 736 is mounted onto the flat panel base 735 at the top of metallic pin 731, with the upper electrode of the die 736 connected by the metallic wire 738 to a top electrode at the upper part of the metallic pin 733. The flat panel base 735 also has a reflective device for reflecting light emitted by the LED die 736. Similarly, the LED dies 736 and 737 are mounted onto the flat panel bases on the sides of the metallic pin 731 slightly below the top, with the upper electrodes of the dies 732 and 737 connected by metallic wires 739 and 746 (as shown in FIG. 13b) to the upper part of the metallic pin 733. LED dies 732, 736 and 737 are mounted onto their respective flat panel bases by a method such as soldering, gluing using a gold paste, gluing using a silver paste or bonding with Indium. The spherical epoxy housing 734 enable the emitted light LED all has the same radial focus. LED die 736 emits light from the upper part of the package, while LED dies 732 and 737 emit light from two sides of the package.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A packaging design for light emitting diodes comprising:

an epoxy housing;
a plurality of light emitting diode dies;
a plurality of metallic pins;
a plurality of flat panel bases a the upper end of the metallic pins for mounting the light emitting diode dies wherein the plurality of flat panel bases include conical or hemi-ellipsoid reflecting mirrors; and
a plurality of metallic wires for connecting a terminal of the light emitting diode die to the metallic pin.

2. The packaging design of claim 1, wherein the light emitting diode die is mounted onto the flat panel base by a method such as soldering, gluing using a gold epoxy, gluing using a silver epoxy or mounting with Indium.

3. The packaging design of claim 1, wherein the LED package includes using two light emitting diode dies and two flat panel bases.

4. The packaging design of claim 3, wherein the LED package includes using three metallic pins where one metallic pin acts an anode pin and the remaining two act as cathode pins.

5. The packaging design of claim 4, wherein the flat panel bases are on the upper part of the respective cathode pins, where the first flat panel base faces the top of the housing while the second flat panel faces the side of the housing.

6. The packaging design of claim 4, wherein the two light emitting diode dies mount onto the respective flat panel bases.

7. The packaging design of claim 3, wherein the light emitting diode die is mounted onto the flat panel base by a method such as soldering, gluing using a gold paste, gluing using a silver paste or mounting with Indium.

8. The packaging design of claim 4, wherein the flat panel bases are on the upper part of the respective cathode pins, where the first flat panel base faces one side of the housing while the second flat panel faces the opposite side of the housing.

9. The packaging design of claim 3, wherein the LED package includes using two metallic pins where one metallic pin acts an anode pin and the other one acts as cathode pins.

10. The packaging design of claim 9, wherein two flat panel bases for mounting two light emitting diode dies are located at the upper part of the first metallic pin and that the light emitting directions for the two light emitting diode dies are perpendicular to the metallic pin.

11. The packaging design of claim 1, wherein the LED package includes using three light emitting diode dies and three flat panel bases.

12. The packaging design of claim 11, wherein the LED package includes using two metallic pins where one metallic pin acts an anode pin and the other one acts as cathode pins.

13. The packaging design of claim 12, wherein one flat panel base is located on the top end of the cathode pin and two other flat panel bases are back-to-back and located on each side in the upper part of the cathode pin, where the first flat panel base faces the top of the housing while the two flat panel bases face opposite sides of the housing.

14. The packaging design of claim 13, wherein the two back-to-back flat panel bases on each side of the upper part of the cathode pin can have symmetrical tilt angles smaller than 90° with respect to a line parallel to the vertical cathode pin direction.

15. The packaging design of claim 12, wherein the three light emitting diode dies mount onto the three flat panel bases respectively.

16. The packaging design of claim 11, wherein the light emitting diode die is mounted onto the flat panel base by a method such as soldering, gluing using a gold paste, gluing using a silver paste or mounting with Indium.

17. The packaging design of claim 11, wherein the epoxy housing is a spherical shaped epoxy housing.

18. The packaging design of claim 17, wherein the LED package includes using two metallic pins where one metallic pin acts an anode pin and the other one acts as cathode pins.

19. The packaging design of claim 18, wherein one flat panel base is located on the top end of the cathode pin and two flat panel bases are located in the upper sides of the cathode pin backing on each other, where the first flat panel base faces the top of the housing while the two flat panel bases face opposite sides of the housing.

20. The packaging design of claim 18, wherein the three light emitting diode dies mount onto the three flat panel bases respectively.

21. The packaging design of claim 18, wherein the light emitting diode die is mounted onto the flat panel base by a method such as soldering, gluing using a gold paste, gluing using a silver paste or mounting with Indium.

22. The packaging design of claim 1, wherein the LED package includes using four light emitting diode dies and four flat panel bases.

23. The packaging design of claim 22, wherein the LED package includes using two metallic pins where one metallic pin acts an anode pin and the other one acts as cathode pins.

24. The packaging design of claim 23, wherein the upper part of the first metallic pin includes four mutually perpendicular flat panel bases formed into a square or a rectangle and having a hollow in the middle, each flat panel base has a light emitting diode die mounted on it, the second metallic pin is placed in the middle, and having an electrode at the upper end for electrically connecting with the respective terminals of the four light emitting diode dies by metallic wires.

25. The packaging design of claim 23, wherein to be light emitting diode die is mounted onto the flat panel base by a method such as soldering, gluing using a gold paste, gluing using a silver paste or mounting with Indium.

26. The packaging design of claim 1, wherein the LED package includes using five light emitting diode dies and five flat panel bases.

27. The packaging design of claim 26, wherein the LED package includes using three metallic pins where one metallic pin acts an anode pin and the remaining two act as cathode pins.

28. The packaging design of claim 27, wherein the upper part of the first metallic pin includes four mutually perpendicular flat panel bases formed into a square or a rectangle having a hollow in the middle, each flat panel base has a light emitting diode die mounted on it, the other two metallic pins are placed in the middle with one metallic pin having a flat panel base at its upper end for mounting the fifth light emitting diode die, and the other metallic pin has an electrode at the upper end for electrically connecting with the respective terminal of the five light emitting diode dies by metallic wires.

29. The packaging design of claim 27, wherein the light emitting diode die is mounted onto the flat panel base by a method such as soldering, gluing using a gold paste, gluing using a silver paste or mounting with Indium.

30. A light emitting diode cluster formed by clustering a plurality of light emitting diodes serving as a lamp or big display screen, wherein the light emitting diode package comprises:
   an epoxy housing;
   a plurality of light emitting diode dies;
   a plurality of metallic pins;
   a plurality of flat panel bases a the upper end of the metallic pins for mounting the light emitting diode dies wherein each of the plurality of light emitting diode dies and the plurality of flat panel bases are located so as to face in a different direction; and
   a plurality of metallic wires for connecting a terminal of the light emitting diode die to the metallic pin.

* * * * *